United States Patent [19]

Yamagata

[11] Patent Number: 5,015,308

[45] Date of Patent: May 14, 1991

[54] CORROSION-RESISTANT AND HEAT-RESISTANT AMORPHOUS ALUMINUM-BASED ALLOY THIN FILM AND PROCESS FOR PRODUCING THE SAME

[75] Inventor: Hiroshi Yamagata, Tateyama, Japan

[73] Assignees: Tsuyoshi Masumoto; Yoshida Kogyo K.K., both of Japan; a part interest

[21] Appl. No.: 378,169

[22] Filed: Jul. 11, 1989

[30] Foreign Application Priority Data

Jul. 22, 1988 [JP] Japan .................................. 63-181625

[51] Int. Cl.$^5$ .......................... C22C 21/00; C22C 1/00
[52] U.S. Cl. ............................... 148/403; 204/192.12;
204/192.14; 423/51; 427/294; 427/295;
427/296; 428/650
[58] Field of Search ........................ 148/403; 423/51;
428/650; 204/192.12, 192.14, 192.31; 427/294,
295, 296

[56] References Cited

PUBLICATIONS

Efimou et al., "Supersaturation of the Solid Solution in Aluminum Binary Alloys during Rapid Quenching", Chemical Abstracts, No. 112:221260t, 1989.

Primary Examiner—R. Dean
Assistant Examiner—David W. Schumaker
Attorney, Agent, or Firm—Hill, Van Santen, Steadman & Simpson

[57] ABSTRACT

The present invention provides a corrosion-resistant and heat-resistant aluminum-based alloy thin film consisting of a composite having a composition represented by the general formula, $Al_a Ni_b X_c N_d$, wherein: X is a metal element selected from Y and Zr and a, b, c and d are as follows, in atomic percentages: $70 \leq a \leq 93$, $0.5 \leq b \leq 7.5$, $0.5 \leq c \leq 12$ and $1 \leq d \leq 18$, the composite being at least 50% (by volume) composed of an amorphous phase. The thin films are produced by depositing a material having the composition represented by the above-defined general formula onto a substrate by a thin film formation technique, such as sputtering, vacuum deposition or ion plating. In the production process, only nitrogen may be supplied as gas. The novel aluminum-based alloy thin film has superior corrosion-resistance and heat-resistance together with high levels of hardness and wear resistance. Further, the thin films can be subjected to a high degree of bending.

4 Claims, 1 Drawing Sheet

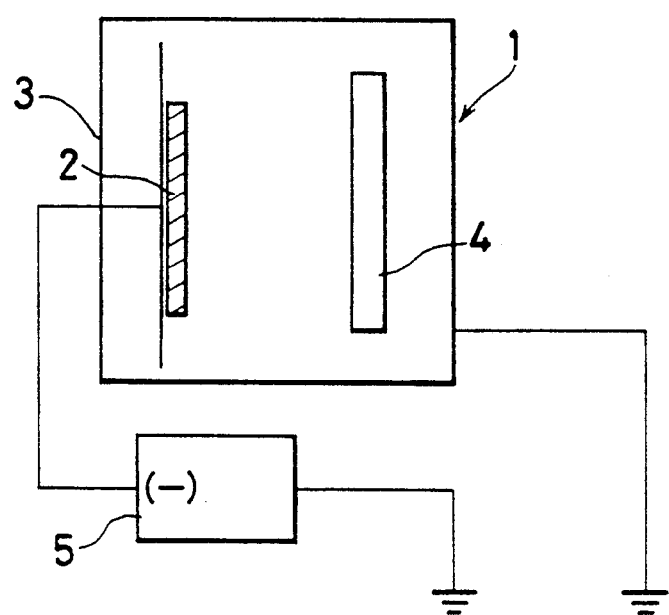

CORROSION-RESISTANT AND HEAT-RESISTANT AMORPHOUS ALUMINUM-BASED ALLOY THIN FILM AND PROCESS FOR PRODUCING THE SAME

BACKGROUND OF THE INVENTION

1. Field of the Invention

The present invention relates to aluminum-based alloy thin films which have superior corrosion resistance and heat resistance together with high levels of hardness, strength and wear resistance.

The present invention further relates to a process for producing such aluminum-based alloy thin films.

2. Description of the Prior Art

There have been heretofore known thin films of pure aluminum and aluminum-based alloys, such as Al-Mg alloy, Al-Mn alloy, etc. and the aluminum or aluminum-based alloy thin films have been used extensively in a variety of applications, for example, as electronics materials, packaging materials, ornamental materials, etc., depending on their properties. The thin films have been produced by using various thin film formation techniques, such as rolling, laminating, vacuum deposition, sputtering, etc.

Such conventional aluminum-based alloy thin films generally exhibit low hardness, low thermal resistance and insufficient corrosion resistance.

SUMMARY OF THE INVENTION

In view of the foregoing, an object of this invention is to provide novel aluminum-based alloy thin films at a relatively low cost which have an advantageous combination of properties of high hardness, good wear resistance, superior corrosion resistance and superior heat resistance and can be also subjected to a large degree of bending.

According to a first aspect of the present invention, there is provided a corrosion-resistant and heat-resistant aluminum-based alloy thin film consisting of a composite which has a composition represented by the general formula:

$Al_a Ni_b X_c N_d$ wherein:
X is a metal element selected from Y and Zr and a, b, c and d are atomic percentages falling within the following ranges:
$70 \leq a \leq 93$, $0.5 \leq b \leq 7.5$, $0.5 \leq c \leq 12$ and $1 \leq d \leq 18$, the composite being at least 50% by volume composed of an amorphous phase.

Another aspect of the present invention is directed to a process for producing the corrosion-resistant and heat-resistant aluminum-based alloy thin film in which a material prepared so as to provide a composition represented by the above general formula is deposited onto a substrate by a thin film formation technique and thereby the thin film having the composition defined above is formed.

In the material to be deposited, only nitrogen may be supplied as gas and as the thin film formation technique, there may be employed sputtering, vacuum deposition, ion plating, etc.

As the substrate, there may be used metal or resin materials in a plate, wire, filament, pipe or deformed form.

According to the present invention, there is provided novel aluminum-based alloy thin films at relatively low cost which have high levels of hardness and wear resistance and are also superior in corrosion resistance and heat resistance. Further, the aluminum-based thin films of the present invention can be subjected to a high degree of bending, without any problem.

BRIEF DESCRIPTION OF THE DRAWING

The single FIGURE is a schematic view illustrating one embodiment of the production process according to the present invention.

DETAILED DESCRIPTION OF THE PREFERRED EMBODIMENTS

The reason why a, b, c and d are limited to the above-defined ranges, in atomic percentages, in the aluminum-based alloy thin films represented by the above general formula is that when they stray from the respective ranges, formation of an amorphous phase becomes difficult and the composite at least 50% by volume of which is composed of an amorphous phase can not be obtained by industrial techniques such as sputtering, etc. Further, a,b,c and d outside the above-defined ranges will make the resultant thin films brittle, thereby presenting difficulties in bending operation.

Element "X" is a metal element selected from Zr and Y and has an effect of improving the ability to form the amorphous structure. Further, the element "X" improves not only the corrosion resistance but also the hardness and strength.

Ni element has an effect of improving the ability to form the amorphous structure and, as another significant effect, imparts ductility to the thin films while retaining the amorphous structure.

Nitrogen (N) element is dispersed throughout the alloy and provides an effect of stabilizing the amorphous phase by forming a chemical and strong bond especially to aluminum. Further, this element provides a considerable improvement in the crystallization temperature.

The aluminum-based alloy thin films of the present invention have a high degree of toughness depending upon their compositions and some of them can be subjected to bending of 180° without cracking or peeling from the substrate.

The thin films of the present invention are prepared by depositing a source material as defined above onto the metallic or resin substrate which may be in the form of plate, wire, filament or pipe or a deformed form, by means of thin film formation techniques, such as sputtering, vacuum deposition, ion plating, etc.

As the sputtering deposition process, there may be mentioned diode sputtering process, triode sputtering process, tetrode sputtering process, magnetron sputtering process, opposing target sputtering process, ion beam sputtering process, dual ion beam sputtering process, etc. and, in the former five processes, there are a direct current application type and a high-frequency application type. In the process of the present invention, any of these processes may be employed. Besides the foregoing sputtering processes, vacuum deposition process and ion plating process may be also employed to carry out the present invention.

Now, the sputtering deposition process will be more specifically described hereinafter. In the sputtering deposition process, a target having the same composition as that of the thin film to be formed is bombarded by ion sources produced in the ion gun or the plasma, etc., so that neutral particles or ion particles in the state of atom, molecular or cluster are produced from the target upon the bombardment. The neutral or ion particles produced in a such manner are deposited onto the substrate and the thin film as defined above is formed.

Nitrogen element used in the invention process may be incorporated either as a nitride with other elements in the target or as gas in a sputtering atmosphere.

Particularly, ion beam sputtering, plasma sputtering, etc., are effective and these sputtering processes provide a cooling rate of the order of $10^5$ to $10^7$ K/sec. Due to such a cooling rate, it is possible to produce the alloy thin film having at least 50 volume % of an amorphous phase. The thickness of the thin film can be adjusted by the sputtering time and, usually, the thin film formation rate is on the order of 2 to 7 $\mu$m per hour.

A further embodiment of the present invention in which magnetron plasma sputtering is employed is specifically described. In a sputtering chamber in which the sputtering gas is held at a low pressure ranging from $1 \times 10^{-3}$ to $10 \times 10^{-3}$ mbar, an electrode (anode) and a target (cathode) composed of a composition excluding nitrogen from the composition defined above are disposed opposite to one another with a spacing of 40 to 80 mm and a voltage of 200 to 500 V is applied to form plasma between the electrodes. A substrate on which the thin film is to be deposited is disposed in this plasma forming area or in the vicinity of the area and the thin film is formed. The sputtering gas consists mainly of argon gas and nitrogen gas is incorporated into it. The nitrogen gas content in the sputtering gas is varied within the range of 5 to 20% by volume depending upon the nitrogen content of the intended thin film and thereby the nitrogen content of the thin film is controlled. Basically, sputtering is possible in a closed system sealing the sputtering gas therein, but the sputtering is preferably carried out in such a manner that the sputtering gas is admitted at a predetermined flow rate (50–200 sccm) into the sputtering chamber while evacuating by a vacuum pump so that the total pressure of the sputtering gas and the partial gas pressures of argon gas and nitrogen gas are kept constant. As described above, when the nitrogen component is contained in the target, the introduction of nitrogen gas may be omitted.

This invention will now be described in detail with reference to the following examples and comparative examples.

EXAMPLE 1

A target 2 having a predetermined composition which contained constituent elements other than nitrogen in amounts within the range of the present invention was prepared by using a vaccum arc melting furnace. As shown in the figure, the target 2 is arranged opposite to an electrode 3 (anode) disposed in a sputtering device 1 and a substrate (glass plate) 4 was disposed between the electrode 3 and the target 2. The distance between the target 2 and the substrate 4 was 40 mm. The sputtering device 1 was evacuated to $10^{-5}$ mbar by driving a vacuum pump (not shown in the figure), and then argon gas was admitted into the sputtering device 1 at a constant flow rate of 150 sccm. In order to add a nitrogen component into the resulting thin film, nitrogen gas was also fed at flow rates of 5 sccm, 10 sccm, 15 sccm, 18 sccm, 20 sccm and 23 sccm, respectively, together with the argon gas. The pressure within the sputtering device 1 was held within the range of $7 \times 10^{-3}$ to $7.4 \times 10^{-3}$ mbar by appropriately driving the vacuum pump. Under such conditions, sputtering was carried out for a period of 60 minutes while 200 V to 400 V (1.5 W/cm$^2$) was applied between the electrodes.

For comparison, sputtering deposition was carried out in the absence of nitrogen gas and in the an excess nitrogen gas of 30 sccm, respectively. In the figure, reference numeral 5 indicates an electric power source.

Under the above processing conditions, 14 kinds of alloy thin films (thickness: about 3 $\mu$m) having compositions (by atomic %) as given in the following Table were obtained by varying the composition of the target 2. Each alloy thin film was examined by X-ray diffraction and the results are shown in the Table.

Hardness (Hv) was measured for each alloy thin film and was given in the Table. The hardness (Hv) is indicated by the value measured using a micro Vickers hardness tester under 10 g.

Further, in order to examine the thermal stability of the alloy thin films, each alloy thin film was subjected to heat treatments in which the treating temperature was raised stepwise by 50° C. within the temperature range of from 50° to 800° C. and each treating temperature was held for a period of one hour. The critical treating temperature above which halo patterns characteristic of amorphous structure are no longer detected by X-ray diffraction is indicated as crystallization temperature (Tx) in the same table.

In addition, corrosion resistance test in a hydrochloric acid solution (1N HCl at 50° C.) and toughness test were also conducted and the test results are shown in the Table.

The compositions of the thin films shown in the Table were determined by quantitative analysis using an X-ray microanalyzer after sputtering.

TABLE

| No. | Composition of target | Nitrogen gas flow rate | Composition of thin film |
|---|---|---|---|
| 1 | $Al_{86}Ni_8Zr_6$ | 0 sccm | $Al_{88.3}Ni_{7.5}Zr_{4.2}$ |
| 2 | $Al_{86}Ni_8Zr_6$ | 10 sccm | $Al_{81.4}Ni_{7.5}Zr_{5.7}N_{5.4}$ |
| 3 | $Al_{86}Ni_8Zr_6$ | 20 sccm | $Al_{74.8}Ni_{7.0}Zr_{5.2}N_{13.0}$ |
| 4 | $Al_{86}Ni_8Zr_6$ | 30 sccm | $Al_{68.7}Ni_{6.4}Zr_{4.8}N_{20.1}$ |
| 5 | $Al_{91}Ni_5Zr_4$ | 18 sccm | $Al_{82.3}Ni_{4.2}Zr_{3.3}N_{10.2}$ |
| 6 | $Al_{89}Ni_4Zr_7$ | 20 sccm | $Al_{78.5}Ni_{3.5}Zr_{5.6}N_{12.4}$ |
| 7 | $Al_{84}Ni_8Zr_8$ | 23 sccm | $Al_{73.8}Ni_{6.9}Zr_{4.6}N_{14.7}$ |
| 8 | $Al_{85}Ni_5Y_{10}$ | 0 sccm | $Al_{87.1}Ni_{4.3}Y_{8.6}$ |
| 9 | $Al_{85}Ni_5Y_{10}$ | 10 sccm | $Al_{80.7}Ni_{2.9}Y_{10.2}N_{6.2}$ |
| 10 | $Al_{85}Ni_5Y_{10}$ | 20 sccm | $Al_{71.7}Ni_{3.0}Y_{9.0}N_{16.3}$ |
| 11 | $Al_{85}Ni_5Y_{10}$ | 30 sccm | $Al_{63.5}Ni_{3.8}Y_{5.5}N_{27.2}$ |
| 12 | $Al_{93}Ni_3Y_4$ | 5 sccm | $Al_{90.8}Ni_{2.1}Y_{4.4}N_{2.7}$ |
| 13 | $Al_{90}Ni_7Y_3$ | 15 sccm | $Al_{81.5}Ni_{6.2}Y_{2.2}N_{10.1}$ |
| 14 | $Al_{83}Ni_7Y_{10}$ | 15 sccm | $Al_{74.7}Ni_{6.4}Y_{9.1}N_{9.8}$ |

| No. | Tx (°C.) | Hv (DPN) | Corrosion resistance, (1) | Toughness |
|---|---|---|---|---|
| 1 | 353 | 453 | 620 min | tough (2) |
| 2 | — | 626 | — | tough |
| 3 | — | 680 | — | tough |
| 4 | Cry (3) | 730 | — | brittle (2) |
| 5 | 550 | 605 | 810 min | tough |
| 6 | 650 | 655 | 912 min | tough |
| 7 | 650 | 730 | 1033 min | tough |
| 8 | 272 | 410 | 730 min | tough (2) |
| 9 | — | 486 | — | tough |
| 10 | — | 610 | — | tough |
| 11 | — | 787 | — | brittle (2) |
| 12 | 450 | 459 | 1578 min | tough |

TABLE-continued

| | | | | |
|---|---|---|---|---|
| 13 | 600 | 560 | 2520 min | tough |
| 14 | 600 | 583 | 2238 min | tough |

Remark:
(1) Corrosion Resistance: dissolution time of thin films in an aqueous solution of HCl (1N) at 50° C.
(2) Data for comparison
(3) Crystallization occurrred during sputtering Symbol "—": unmeasured As shown in the table, the aluminum-based alloy thin films of the present invention have a very high hardness of the order of about 200 to 800 DPN as compared with the hardness level of 50 to 100 DPN of ordinary aluminum-based alloys. Further, in comparison with the nitrogen-free thin films No. 1 and No. 8 (comparative examples), it has been found that the thin films of the present invention are considerably improved in the hardness.

On the other hand, it has been found that thin films No. 4 and No. 11 which contain nitrogen in amounts beyond the ranges of the present invention have an improved hardness but exhibit a reduced ductility and, as indicated in the table, the thin film No. 4 is crystallized since nitrogen is contained in a amount exceeding the range providing an amorphous structure. As a further remarkable feature, the amorphous alloy thin films of the present invention have high levels of crystallization temperature (Tx) not less than 400° C. and exhibit a good heat resistance. Particularly, the crystallization temperature is considerably improved by addition of nitrogen. Similarly, it has been found that the corrosion resistance of the invention thin films is also greatly improved.

EXAMPLE 2

Sputtering deposition was carried out under the same sputtering conditions as thin film No. 10 in Example 1 shown in the table, using a polyester monofilament (1 mm in diameter) as a substrate and there was obtained a thin film of $Al_{79.5}Ni_{3.2}Y_{4.3}N_{13.0}$.

The thin film was subjected to bending test of 180° and no cracking or peeling was observed in the sputtered thin film. The test results reveal that the sputtered thin film has a superior ductility and the amorphous alloy thin film so deposited onto the monofilament can be subjected to various processing operations.

What is claimed is:

1. A corrosion-resistant and heat-resistant aluminum-based alloy thin film having a composition represented by the general formula:

$$Al_aNi_bX_cN_d$$

wherein: X is a metal element selected from Y and Zr and a, b, c and d are atomic percentages falling within the following ranges:
$70 \leq a \leq 93$, $0.5 \leq b \leq 7.5$, $0.5 \leq c \leq 12$ and $1 \leq d \leq 18$, said film being at least 50% by volume composed of an amorphous phase.

2. A process for producing a corrosion-resistant and heat-resistant aluminum-based alloy thin film, said film being at least 50% by volume of an amorphous phase, said process comprising depositing a material prepared so as to provide a composition represented by the general formula:

$$Al_aNi_bX_cN_d$$

wherein X is a metal selected from Y and Zr and a, b, c and d are atomic percentages falling within the following ranges:
$70 > a > 93$, $0.5 > b > 7.5$, $0.5 > c > 12$ and $1 > d > 18$, onto a substrate by a thin film formation technique selected from a group of techniques consisting of ion plating, sputtering and vacuum depositing and thereby forming the thin film having said composition.

3. A process as claimed in claim 2 in which nitrogen of said material is supplied as gas.

4. A process as claimed in claim 2 in which said substrate is metal or resin in the form of plate, wire, filament or pipe or a deformed form.

* * * * *